United States Patent
Lee et al.

(10) Patent No.: US 6,486,059 B2
(45) Date of Patent: Nov. 26, 2002

(54) DUAL DAMASCENE PROCESS USING AN OXIDE LINER FOR A DIELECTRIC BARRIER LAYER

(75) Inventors: Shyh-Dar Lee, Hsinchu Hsien (TW); Chen-Chiu Hsue, Hsinchu (TW)

(73) Assignee: Silicon Intergrated Systems Corp., Hsin Chu (TW)

(*) Notice: Subject to any disclaimer, the term of this patent is extended or adjusted under 35 U.S.C. 154(b) by 0 days.

(21) Appl. No.: 09/841,568

(22) Filed: Apr. 19, 2001

(65) Prior Publication Data

US 2002/0155695 A1 Oct. 24, 2002

(51) Int. Cl.[7] .......................................... H01L 21/4763
(52) U.S. Cl. .................................... 438/637; 438/700
(58) Field of Search ................................ 438/622, 633, 438/634, 635, 636, 637, 643, 648, 650, 656, 680, 683, 685, 687, 695, 689, 723, 724, 744, 700, 738

(56) References Cited

U.S. PATENT DOCUMENTS 5,916,823 A * 6/1999 Lou et al. .................. 438/738
6,323,121 B1 * 11/2001 Liu et al. .................. 438/633
6,340,435 B1 * 1/2002 Bjorkman et al. ............ 216/72

* cited by examiner

Primary Examiner—David Nelms
Assistant Examiner—David Nhu
(74) Attorney, Agent, or Firm—Darby & Darby

(57) ABSTRACT

A dual damascene process is applied on a semiconductor substrate having a dual damascene opening with a via hole which exposes a metal wire and is surrounded by a first low-k dielectric layer, and a trench which is over the via hole and surrounded by a second low-k dielectric layer. An in-situ oxide liner, serving as a dielectric barrier layer, is formed on the sidewall of the first low-k dielectric layer and the second low-k dielectric layer. A metal barrier layer is conformally deposited on the exposed surface of the semiconductor substrate to cover the sidewall and bottom of the dual damascene opening. The dual damascene opening is filled with a conductive layer, and then the excess conductive layer outside the trench level is polished away by a CMP process.

20 Claims, 6 Drawing Sheets

DUAL DAMASCENE PROCESS USING AN OXIDE LINER FOR A DIELECTRIC BARRIER LAYER

BACKGROUND OF THE INVENTION

1. Field of the Invention

The present invention relates to a dual damascene process and, more particularly, to a dual damascene process for increasing the adhesion between the inter-level dielectric and a metal barrier layer in which an in-situ oxide liner is used for a dielectric barrier layer.

2. Description of the Related Art

In semiconductor processing, multiple metallization layers are employed in order to accommodate higher densities as device dimensions shrink well below 0.25 m design rules. One example of an advanced interconnect architecture is a dual damascene structure. The dual damascene process offers advantages in process simplification, lithography and critical dimension control. In addition, because of the simplicity of the dual damascene process, materials of the conductive layer/inter-level dielectric (ILD) using an existing aluminum/silicon oxide scheme can be cost-effectively replaced by the use of a copper/low-dielectric constant (low-k) material scheme.

One drawback of using copper is that copper diffuses/drifts easily into adjoining low-k ILD, and it causes damage to neighboring devices on the semiconductor substrate. Furthermore, copper may reach the silicon substrate and then degrade the performance of device. To solve this problem, a metal barrier layer made of Ta/TaN, Ti/TiN or W/WN layer is provided to encapsulate copper from the surrounding ILD. The metal barrier layer can prevent possible interaction between the copper interconnect and the low-k ILD, and also provide adhesion therebetween.

FIGS. 1A to 1C depict a dual damascene process using a metal barrier layer according to the prior art. Referring to FIG. 1A, on a semiconductor substrate 10, a dual damascene opening 25 comprises a via hole 23 that exposes a predetermined region of a conductive wire 12 and is surrounded by a first low-k ILD 16, and a trench 24 that is over the via hole 23 and surrounded by a second low-k ILD 20. A dielectric separation layer 14 is covered on the semiconductor substrate 10 to expose the predetermined region of the conductive wire 12, an etch stop layer 18 is deposited on the first low-k ILD 16, and a hard mask 22 is patterned on the second low-k ILD 20. Referring to FIG. 1B, a metal barrier layer 26 is deposited on the exposed surface of the semiconductor substrate 10 so as to cover the sidewall of the dual damascene opening 25. Then, a conductive layer 28 made of copper is deposited to fill the dual damascene opening 25. Next, a chemical-mechanical polishing (CMP) process is used to polish away the excess conductive layer 28 above the trench 24 in which the hard mask 22 serves as a polish-stop layer. Thus, as shown in FIG. 1C, the remaining part of the conductive layer 28 serves as the dual damascene structure.

However, another shortcoming associated with the dual damascene structure is the outgassing phenomenon. Outgassing is a critical issue from the first low-k ILD 16 and the second low-k ILD 20 to the metal barrier layer 26. It damages adhesion between the low-k ILD 16, 20 and the metal barrier layer 26, and negatively impacts the thermal reliability/hardness of the dual damascene structure. Thus, a dual damascene process using a dielectric barrier layer between the low-k ILD and the metal barrier layer solving the aforementioned problems is desired.

SUMMARY OF THE INVENTION

It is a principle object of the invention to provide means for increasing the adhesion of the low-k dielectric layer and the metal barrier layer.

It is another object of the invention to prevent outgas effect from the low-k dielectric layer.

Yet another object of the invention is to provide a dual damascene structure with better thermal stability.

It is a further object of the invention to provide a dual damascene structure with better hardness.

Still another object of the invention is to reduce the cost of fabrication of a dual damascene process.

Accordingly, the present invention is a dual damascene process using an in-situ oxide liner for a dielectric barrier layer. In a dual damascene opening, the oxide liner formed on the sidewall of a low-k dielectric layer is sandwiched between the low-k dielectric layer and a metal barrier layer, thus solving the aforementioned problems.

In the dual damascene process, a semiconductor substrate is provided with at least a dual damascene opening having a via hole exposing a predetermined region of a metal wire and surrounded by a first low-k dielectric layer, and a trench over the via hole surrounded by a second low-k dielectric layer. The materials of the first low-k dielectric layer and/or the second low-k dielectric layer may be selected from spin-on polymer (SOP), such as FLARE, SILK, Parylene, PAE-II andpolyimide, and formed through a spin-coating process. Alternatively, the materials of the first low-k dielectric layer and/or the second low-k dielectric layer may be selected from black diamond, Coral, Aurora, Green Dot or other low-k dielectric materials, and formed by a CVD process. It is appreciated that how the dual damascene opening is fabricated is a design choice dependent on the fabrication process being employed.

When a photoresist layer for patterning the dual damascene opening is stripped, an oxidation process is performed prior to a wet cleaning process, thus an in-situ oxide liner is formed on a sidewall of the first low-k dielectric layer and the second low-k dielectric layer to serve as a dielectric barrier layer for improving the adhesion between the low-k ILD and a metal barrier layer. A metal reduction step is then required so as to strip the in-situ oxide liner on the exposed regions of the metal wire. Also, a degas step is needed to remove outgas from the first low-k dielectric layer and the second low-k dielectric layer.

A metal barrier layer, preferably made of Ta/TaN, Ti/TiN or W/WN, is then conformally deposited along the exposed surface of the semiconductor substrate to encapsulate copper interconnect from the surrounding low-k dielectric layer and to provide the adhesion between the copper interconnect and the low-k dielectric layer. Next, a conductive layer made of copper is deposited by, for example, PVD, CVD, electro-plating technique, or a combination of these techniques to fill the dual damascene opening. The conductive layer and the metal barrier layer residing above the trench level are removed, preferably by chemical-mechanical polishing (CMP). The remaining part of the conductive layer serves as the dual damascene structure.

Finally, a sealing layer, preferably made of SiN or SiC, is deposited over the exposed surface of the semiconductor substrate to cover the top of the dual damascene structure. This prevents the dual damascene structure from oxidizing and prevents the atoms/ions in the dual damascene structure from diffusing into a subsequently formed dielectric layer over the dual damascene structure. In addition, by repeating

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
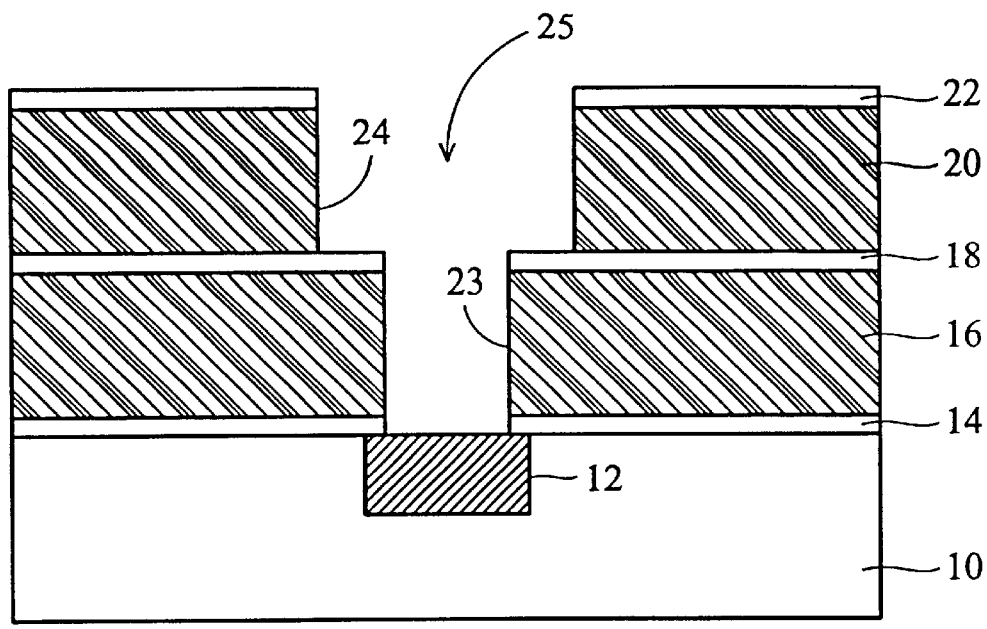
FIGS. 1A to 1C are cross-sectional diagrams of a dual damascene process using a metal barrier layer according to the prior art.
Figure 1B:
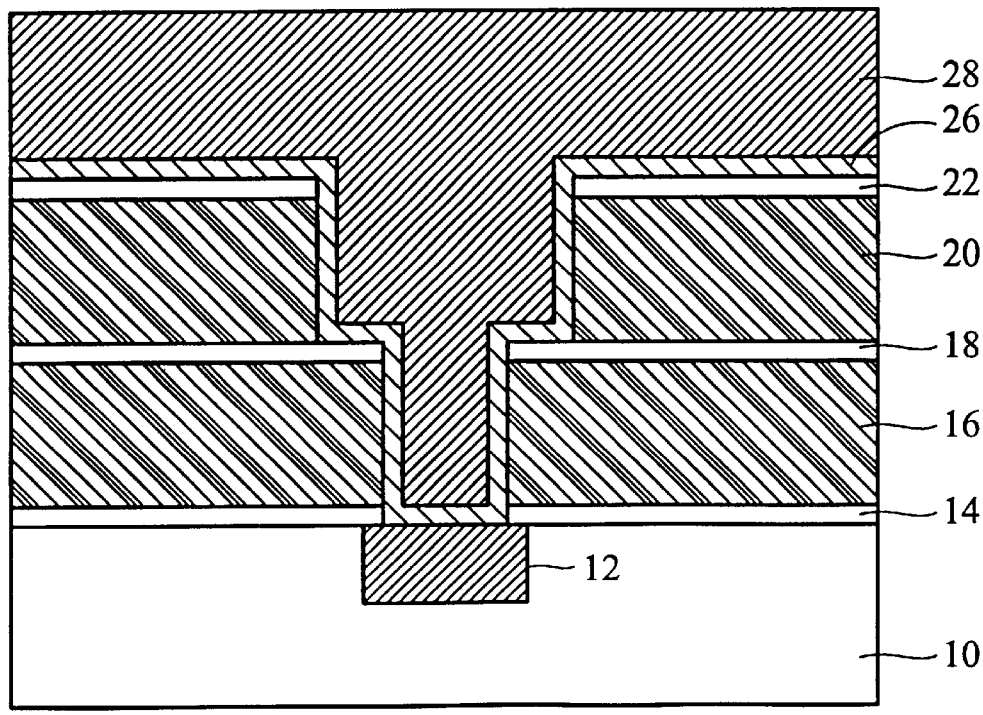
Figure 1C:
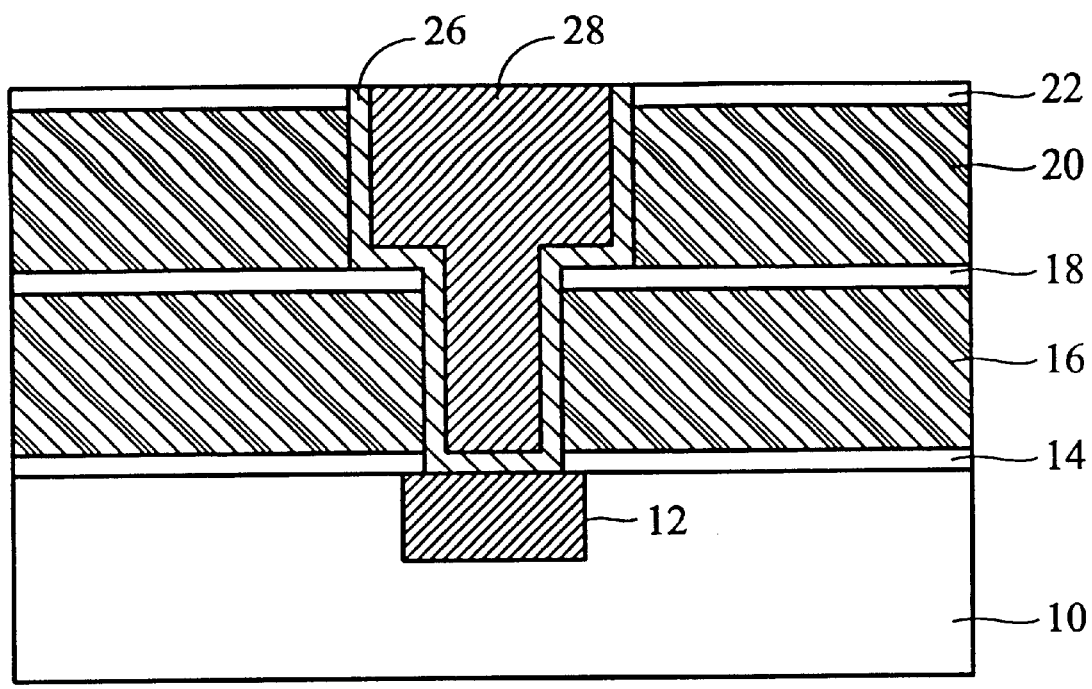
Figure 2A:
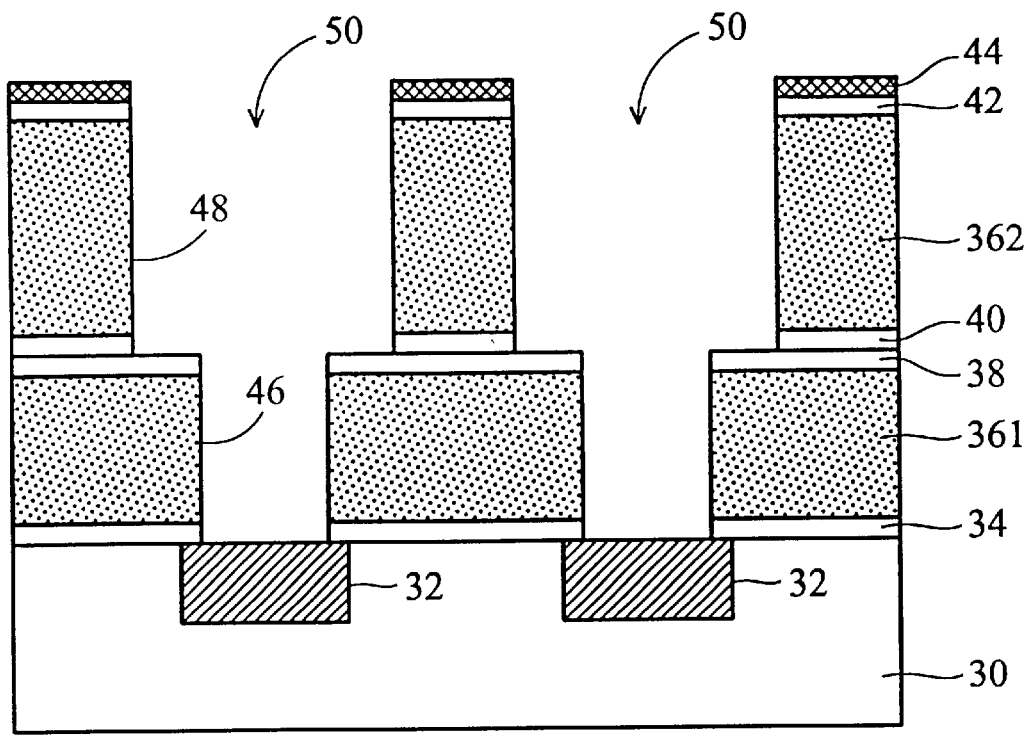
FIGS. 2A to 2G are cross-sectional diagrams of a dual damascene process using an in-situ oxide liner as a dielectric barrier layer according to the present invention.

A dual damascenes process using an in-situ oxide liner as a dielectric barrier layer between a low-k ILD and a metal barrier layer is provided. FIGS. 2A to 2G are cross-sectional diagrams of a dual damascene process using an in-situ oxide liner for a dielectric barrier layer according to the present invention. Referring to FIG. 2A, on a semiconductor substrate 30, a plurality of dual damascene openings 50 are formed to expose a plurality of metal wires 32, preferably made of copper. Each of the dual damascene openings 50 has a via hole 46 which exposes a predetermined region of the metal wire 32 and is surrounded by a first low-k ILD 361, and a trench 48, which is over the via hole 46 and is surrounded by a second low-k ILD 362. The materials of the first low-k ILD 361 or the second low-k ILD 362 maybe selected from spin-on polymer (SOP), such as FLARE, SILK, Parylene, PAE-II and polyimide, and formed through a spin-coating process. Alternatively, the materials of the first low-k ILD 361 or the second low-k ILD 362 may be selected from black diamond, Coral, Aurora, Green Dot or other low-k dielectric materials, and formed by a CVD process. Other processes may also be applied in the formation of the first low-k ILD 361 or the second low-k ILD 362.

In addition, a dielectric separation layer 34 is covered on the semiconductor substrate 30 to expose the predetermined regions of the metal wires 32. The dielectric separation layer 34, preferably made of silicon nitride or silicon carbide, is used to prevent the metal wires 32 from oxidizing and prevent the atoms/ions in the metal wires 32 from diffusing into the first low-k ILD 361. An etching stop layer 38, preferably made of $SiO_2$, SiC, SiN, SRO or SiON, may be deposited on the first low-k ILD 361 to serve as an etching endpoint of the trench 48 and serving as a hard mask of the via hole 46. An anti-reflective coating (ARC) 40 may be formed on the etching stop layer 38 for providing better lithography in patterning the via hole 46. A hard mask layer 42, preferably made of silicon nitride, may be patterned on the second low-k ILD 362. A photoresist layer 44 may be patterned on the hard mask 42 for defining the pattern of the trench 48. It is appreciated that how the dual damascene opening 50 is fabricated is a design choice dependent on the fabrication process being employed.

Figure 2B:
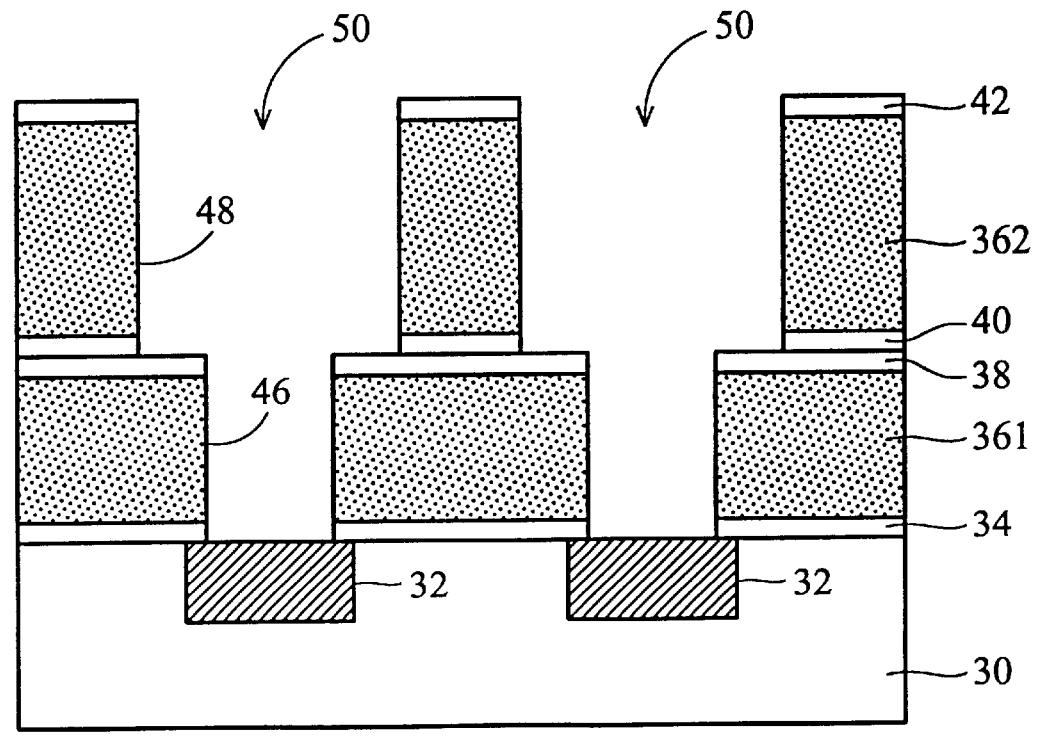
Figure 2C:
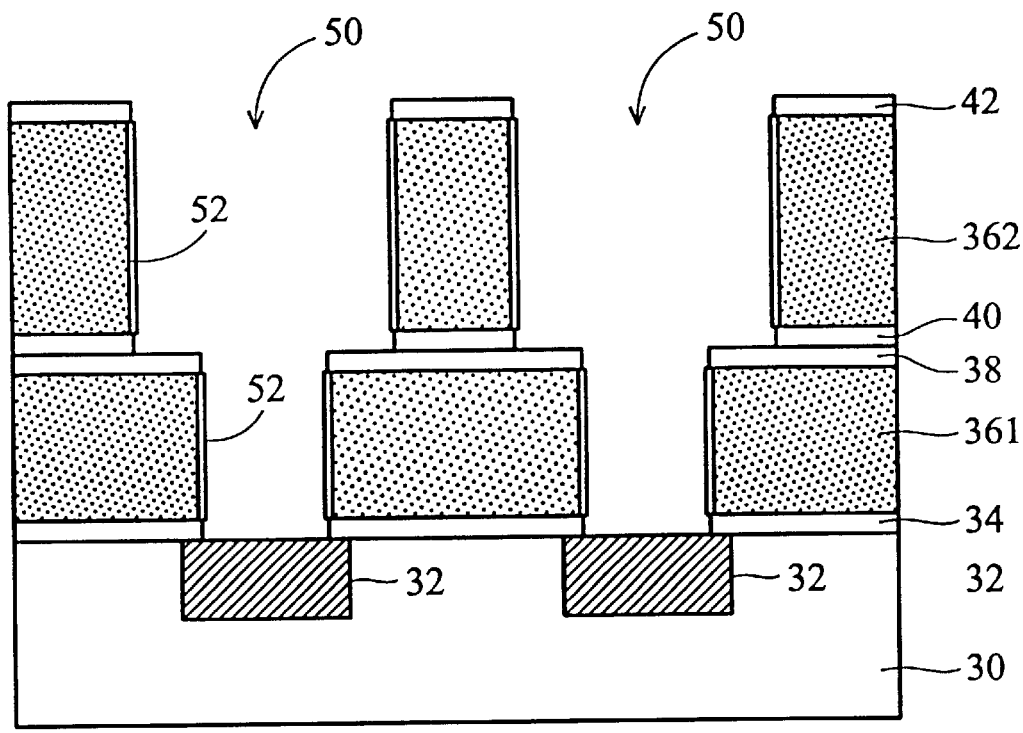

With respect to the dual damascene process of the invention, referring to FIG. 2B, the photoresist layer 44 is stripped after the formation of the dual damascene opening 50. Referring to FIG. 2C, an oxidation process is performed prior to a wet cleaning process, and thereby a plurality of in-situ oxide liners are formed on sidewalls of the first low-k ILD 361 and the second low-k ILD 362 and on the exposed regions of the metal wires 32 (not shown). However, the in-situ oxide liners 52 positioned on the exposed regions of the metal wires 32 increase the contact resistance between the metal wire 32 and a conductive layer formed in the via hole 46 in sequent process. Seeking to solve this problem, a copper reduction step is required so as to strip the in-situ oxide liners 52 on the exposed regions of the metal wires 32. The in-situ oxide liners 52 remaining on the sidewalls of the first low-k ILD 361 and the second low-k ILD 362 serve as a dielectric barrier layer in order to improve the adhesion between the low-k ILD and a metal barrier layer formed in a subsequent process. Furthermore, a degas step is performed to remove outgas from the first low-k ILD 361 and the second low-k ILD 362.

Figure 2D:
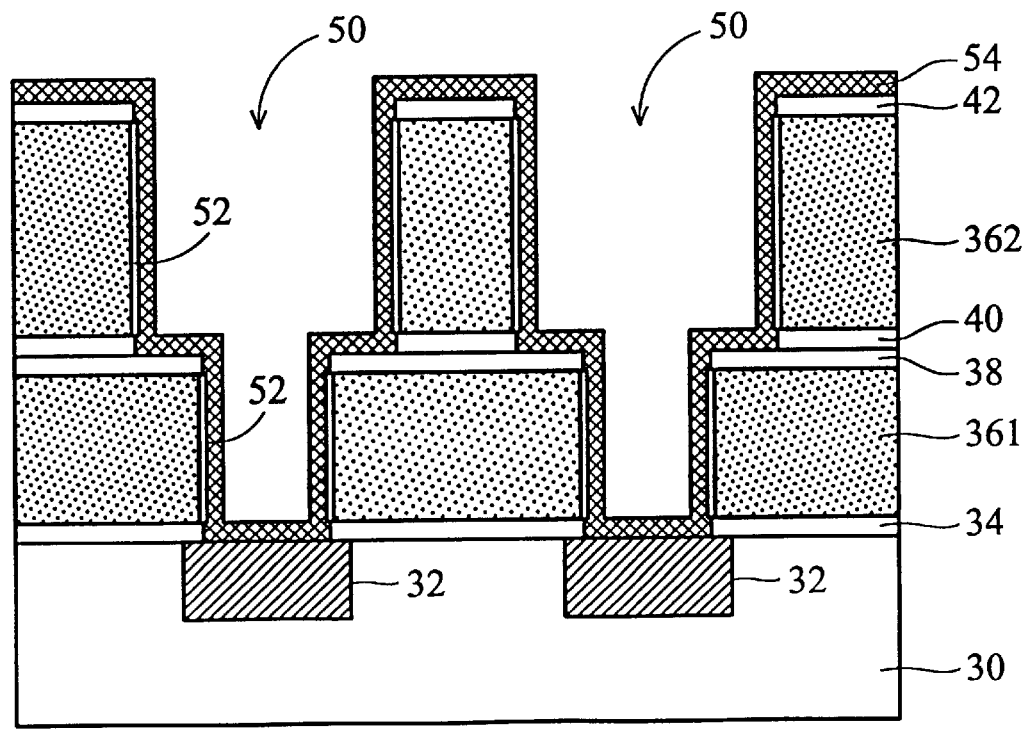
Figure 2E:
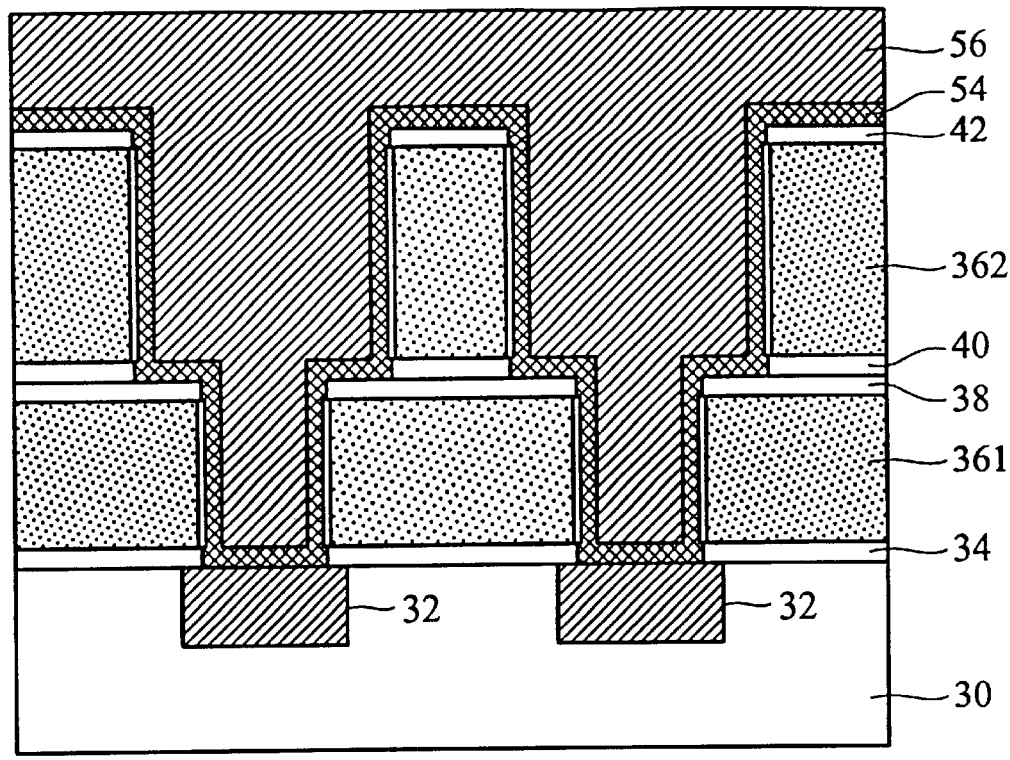
Figure 2F:
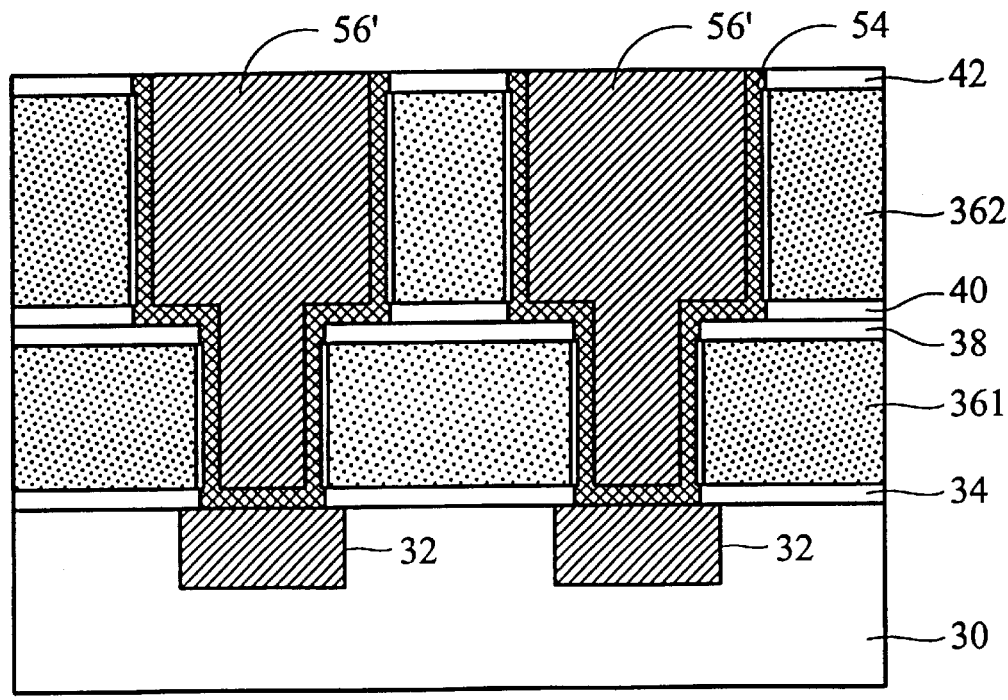

Referring to FIG. 2D, a metal barrier layer 54 is conformally deposited along the exposed surface of the semiconductor substrate 30. Preferably, the metal barrier layer 54 is made of Ta/TaN, Ti/TiN or W/WN. One purpose of the metal barrier layer 54 is to encapsulate the copper interconnect from the surrounding low-k ILD 361 and 362. Another purpose is to enhance the adhesion between copper interconnect and the surrounding low-k ILD 361 and 362. Then, referring to FIG. 2E, a conductive layer 56 made of copper is deposited by, for example, PVD, CVD, electro-plating technique, or a combination of these techniques to fill the dual damascene openings 50. It is appreciated that how the conductive layer 56 is deposited is a design choice dependent on the fabrication process being employed. Next, referring to FIG. 2F, the conductive layer 56 and the metal barrier layer 54 residing above the trench 48 level are removed by either an etching or a polishing technique. In the preferred embodiment, chemical-mechanical polishing (CMP) is used to polish away the excess conductive layer 56 and the metal barrier layer so as to level off the top surface of the conductive layer 56 and the hard mask 42. The remaining part of the conductive layer 56 serves as the dual damascene structure 56'.

Figure 2G:
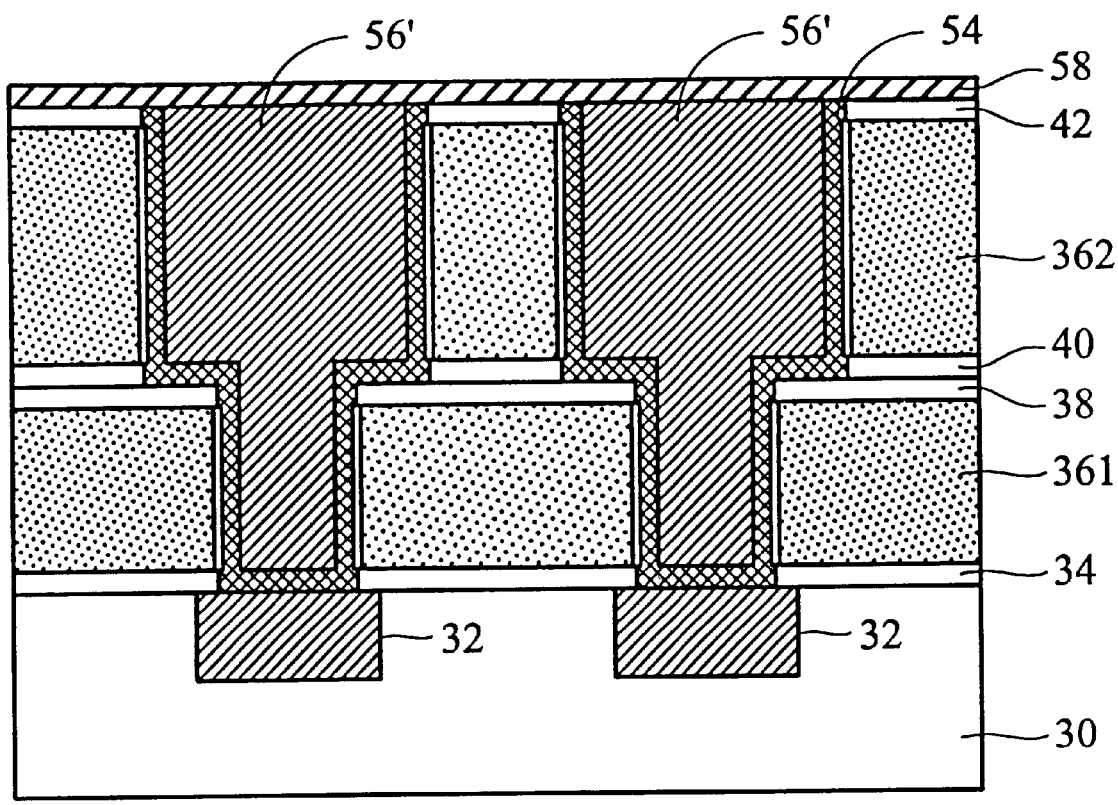

Finally, referring to FIG. 2G, a sealing layer 58 is deposited over the exposed surface of the semiconductor substrate 30 so as to cover the top of the dual damascene structure 56'. The sealing layer 58, preferably made of SiN or SiC, prevents the dual damascene structure 56' from oxidizing and prevents the atoms/ions in the dual damascene structure 56' from diffusing into the subsequently formed dielectric layer (not shown) over the dual damascene structure 56'. In addition, by repeating the processes, additional interconnect structures can be fabricated to form metallization levels above the dual damascene structure 56'.

In the dual damascene process using the in-situ oxide liner 52 for the dielectric barrier layer, the adhesion between the low-k ILD 361 and 362 and the metal barrier layer 54 is significantly improved compared to the prior dual damascene process. In addition, the outgas effect from the low-k ILD 361 and 362 can be further reduced. Also, thermal reliability and hardness of the dual damascene structure 56' can be improved. Besides, since the oxidation step applied to the formation of the in-situ oxide liner 52 can be easily implemented, the cost of fabrication is further reduced.

It is to be understood that the present invention is not limited to the embodiments described above, but encompasses any and all embodiments within the scope of the following claims.

What is claimed is:

1. A dual damascene process comprising the steps of:
   providing a semiconductor substrate having at least a dual damascene opening, wherein the dual damascene opening has a via hole which exposes a metal wire and is surrounded by a first low-k dielectric layer, and a trench which is over the via hole and surrounded by a second low-k dielectric layer;

forming an oxide liner on the sidewall of the first low-k dielectric layer and the second low-k dielectric layer;

performing a degas step;

after performing the degas step, forming a metal barrier layer conformally to cover the sidewall and bottom of the dual damascene opening and the surface of the second low-k dielectric layer;

filling the dual damascene opening with a conductive layer; and removing the excess conductive layer outside the trench level, wherein the remaining part of the conductive layer serves as a dual damascene structure.

2. The dual damascene process according to claim 1, wherein the oxide liner is sandwiched between the low-k dielectric layer and the metal barrier layer.

3. The dual damascene process according to claim 2, wherein the oxide liner is formed by an oxidation process.

4. The dual damascene process according to claim 3, wherein the oxide liner deposited on the exposed metal wire during the oxidation process is removed by a metal reduction step.

5. The dual damascene process according to claim 1, wherein the excess conductive layer is removed by a chemical-mechanical polishing (CMP) process.

6. The dual damascene process according to claim 1, further comprising a step of forming a sealing layer on an exposed surface of the semiconductor substrate so as to cover the top of the dual damascene structure.

7. The dual damascene process according to claim 6, wherein the sealing layer is selected from the material of SiN or SiC.

8. The dual damascene process according to claim 1, wherein the semiconductor substrate has a dielectric separation layer under the first low-k dielectric layer.

9. The dual damascene process according to claim 1, wherein the semiconductor substrate has an etching stop layer over the first low-k dielectric layer.

10. The dual damascene process according to claim 9, wherein the etching stop layer is selected from the material of $SiO_2$, SiC, SiN, SRO or SiON.

11. The dual damascene process according to claim 9, wherein the semiconductor substrate has an anti-reflective coating between the etching stop layer and the second low-k dielectric layer.

12. The dual damascene process according to claim 1, wherein the semiconductor substrate has a hard mask layer patterned on the second low-k dielectric layer.

13. The dual damascene process according to claim 12, wherein the hard mask layer is formed by silicon nitride.

14. The dual damascene process according to claim 1, wherein the metal wire is made of copper.

15. The dual damascene process according to claim 1, wherein the first low-k dielectric layer is made of spin-on polymer.

16. The dual damascene process according to claim 1, wherein the first low-k dielectric layer is deposited by a CVD process.

17. The dual damascene process according to claim 1, wherein the second low-k dielectric layer is made of spin-on polymer.

18. The dual damascene process according to claim 1, wherein the second low-k dielectric layer is deposited by a CVD process.

19. The dual damascene process according to claim 1, wherein the metal barrier layer is selected from the material of Ti, Ta, TiN, or TaN.

20. The dual damascene process according to claim 1, wherein the conductive layer is made of copper.

* * * * *